(12) United States Patent
Kobayashi

(10) Patent No.: US 7,569,403 B2
(45) Date of Patent: Aug. 4, 2009

(54) PATTERN EVALUATION METHOD, MANUFACTURING METHOD OF SEMICONDUCTOR DEVICE, CORRECTION METHOD OF MASK PATTERN AND MANUFACTURING METHOD OF EXPOSURE MASK

(75) Inventor: Yuji Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 929 days.

(21) Appl. No.: 11/132,397

(22) Filed: May 19, 2005

(65) Prior Publication Data

US 2006/0049838 A1   Mar. 9, 2006

(30) Foreign Application Priority Data

May 20, 2004   (JP)   ............... 2004-150386

(51) Int. Cl.
*G01R 31/26* (2006.01)
(52) U.S. Cl. .................. 438/14; 438/57; 438/694; 438/717; 438/763; 438/780; 257/E21.577
(58) Field of Classification Search ............. 438/620; 430/15, 31; 324/699, 715, 716
See application file for complete search history.

(56) References Cited

U.S. PATENT DOCUMENTS

| 6,127,733 | A | 10/2000 | Kinoshita |
| 6,288,556 | B1 | 9/2001 | Sato et al. |
| 6,525,548 | B1 | 2/2003 | Nishio |
| 2005/0250022 | A1* | 11/2005 | Kotani et al. ............ 430/5 |

FOREIGN PATENT DOCUMENTS

| JP | 63-53942 | 3/1988 |
| JP | 4-32216 | 2/1992 |
| JP | 4-116948 | 4/1992 |

OTHER PUBLICATIONS

Notification of Reason for Rejection issued by the Japanese Patent Office on May 23, 2008, for Japanese Patent Application No. 2004-150386, and English-language translation thereof.

* cited by examiner

*Primary Examiner*—N Drew Richards
*Assistant Examiner*—Kyoung Lee
(74) *Attorney, Agent, or Firm*—Finnegan, Henderson, Farabow, Garrett & Dunner, L.L.P.

(57) ABSTRACT

A pattern evaluation method using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, the pattern evaluation method includes:

arranging patterns to be evaluated so that the Mth wiring or a layer in the vicinity thereof is locally removed;
electrically calculating a first characteristic value indicating a characteristic of the first circuit including at least the wiring width of the first wiring;
electrically calculating an Mth characteristic value which is a value indicating the characteristic of the Mth circuit and dependent on a geometric relationship between the pattern to be evaluated and the Mth wiring; and
evaluating the characteristic of the pattern to be evaluated based on the first characteristic value to the Mth characteristic value obtained for at least two circuit groups of the N circuit groups.

20 Claims, 18 Drawing Sheets

$\left(\dfrac{Ra1}{Rc1} \doteqdot 1\right)$ $\left(\dfrac{Ra2}{Rc2} \doteqdot 1\right)$ $\left(\dfrac{Ra3}{Rc3} < 1\right)$ $\left(\dfrac{Ra1}{Re1} \fallingdotseq 1\right)$ $\left(\dfrac{Ra2}{Re2} < 1\right)$ $\left(\dfrac{Ra3}{Re3} < 1\right)$ dimensional measurement. This would cause even hole patterns unnecessary for measurement to be formed on wiring, resulting in a problem that the accuracy of measurement deteriorates.

PATTERN EVALUATION METHOD, MANUFACTURING METHOD OF SEMICONDUCTOR DEVICE, CORRECTION METHOD OF MASK PATTERN AND MANUFACTURING METHOD OF EXPOSURE MASK

CROSS REFERENCE TO RELATED APPLICATIONS

This application claims benefit of priority under 35 USC §119 to Japanese Patent Application No. 2004-150386, filed on May 20, 2004, the contents of which are incorporated by reference herein.

BACKGROUND OF THE INVENTION

1. Field of the Invention

The present invention relates to a pattern evaluation method, a manufacturing method of a semiconductor device, a correction method of a mask pattern and a manufacturing method of an exposure mask.

2. Related Art

In recent years, an OPC (optical proximity correct) or PPC (process proximity correct) can be the to be a technology indispensable to a lithography process for manufacturing of a semiconductor device. The OPC is a technology to carry out a correction on a mask beforehand by estimating deterioration of fidelity of an optical pattern when transferring a pattern from the mask to a resist film on a semiconductor wafer. On the other hand, the PPC is a technology to carry out a correction on a mask beforehand by estimating not only optical deterioration but also deterioration of pattern fidelity when a film to be processed on a semiconductor wafer is processed from a resist pattern. When a wiring pattern is taken as an example, in a line-and-space type pattern with a pattern width A and an inter-wiring space B, the PPC changes the width of the inter-wiring space B with respect to different peripheral environments such as wiring width A, measures how the wiring width A changes with a variation in the space B and corrects dimensions of the mask pattern so that the same wiring width is obtained for all inter-wiring spaces B.

In the case of a hole pattern as well as the above described wiring pattern, data to correct dimensions of the mask pattern is obtained by measuring dimensions of an inter-hole structure while changing the length of the inter-hole structure. In this technology, it is important to accurately estimate in what dimensions a pattern on a mask in an arbitrary size is formed on a resist film or film to be processed. Generally, it is possible to realize a large amount of electrical measurement of dimensions of a wiring pattern using a 4-terminal circuit and corrections have been realized with high accuracy so far.

In the case of a hole pattern, dimensional measurement using an SEM (Scanning Electron Microscope) is in the mainstream. However, measurement using the SEM is not suitable for a large amount of dimensional measurement, and therefore there is a problem that it is difficult to perform high accuracy and speedy corrections compared to a wiring pattern. There is a proposal on a method of electrical measurement of a hole pattern (see Patent Document 1). However, according to the method disclosed in Patent Document 1, it is necessary to form holes similar to holes to be measured for a power supply and voltage measurement. Therefore, when the aim is dimensional measurement for the aforementioned OPC or PPC, it is necessary to provide an environment similar to that of the holes to be measured also for holes for a power supply and voltage measurement. This would cause even hole

BRIEF SUMMARY OF THE INVENTION

According to a first aspect of the present invention, there is provided a pattern evaluation method using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, the pattern evaluation method comprising:

arranging patterns to be evaluated so that the Mth wiring or a layer in the vicinity thereof is locally removed;

electrically calculating a first characteristic value indicating a characteristic of the first circuit including at least the wiring width of the first wiring;

electrically calculating an Mth characteristic value which is a value indicating the characteristic of the Mth circuit and dependent on a geometric relationship between the pattern to be evaluated and the Mth wiring; and evaluating the characteristic of the pattern to be evaluated based on the first characteristic value to the Mth characteristic value obtained for at least two circuit groups of the N circuit groups.

According to a second aspect of the present invention, there is provided a manufacturing method of a semiconductor device comprising a pattern evaluation method using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, the pattern evaluation method comprising:

arranging patterns to be evaluated so that the Mth wiring or a layer in the vicinity thereof is locally removed;

electrically calculating a first characteristic value indicating a characteristic of the first circuit including at least the wiring width of the first wiring;

electrically calculating an Mth characteristic value which is a value indicating the characteristic of the Mth circuit and dependent on a geometric relationship between the pattern to be evaluated and the Mth wiring; and evaluating the characteristic of the pattern to be evaluated based on the first characteristic value to the Mth characteristic value obtained for at least two circuit groups of the N circuit groups.

According to a third aspect of the present invention, there is provided a correction method of a mask pattern comprising evaluating a mask pattern using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, and further comprising correcting the mask pattern on the basis of the evaluation result of the mask pattern, the evaluating the mask pattern including:

arranging mask patterns to be evaluated so that the Mth wiring or a layer in the vicinity thereof is locally removed;

electrically calculating a first characteristic value indicating a characteristic of the first circuit including at least the wiring width of the first wiring;

electrically calculating an Mth characteristic value which is a value indicating the characteristic of the Mth circuit and dependent on a geometric relationship between the mask pattern to be evaluated and the Mth wiring; and evaluating the characteristic of the mask pattern to be evaluated based on the first characteristic value to the Mth characteristic value obtained for at least two circuit groups of the N circuit groups.

According to a fourth aspect of the present invention, there is provided a manufacturing method of an exposure mask comprising a correction method of a mask pattern including evaluating a mask pattern using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, and further including correcting the mask pattern on the basis of the evaluation result of the mask pattern, the evaluating the mask pattern having:

arranging mask patterns to be evaluated so that the Mth wiring or a layer in the vicinity thereof is locally removed;

electrically calculating a first characteristic value indicating a characteristic of the first circuit including at least the wiring width of the first wiring;

electrically calculating an Mth characteristic value which is a value indicating the characteristic of the Mth circuit and dependent on a geometric relationship between the mask pattern to be evaluated and the Mth wiring; and evaluating the characteristic of the mask pattern to be evaluated based on the first characteristic value to the Mth characteristic value obtained for at least two circuit groups of the N circuit groups.

DETAILED DESCRIPTION OF THE INVENTION (1) FIRST EMBODIMENT

Figure 1:
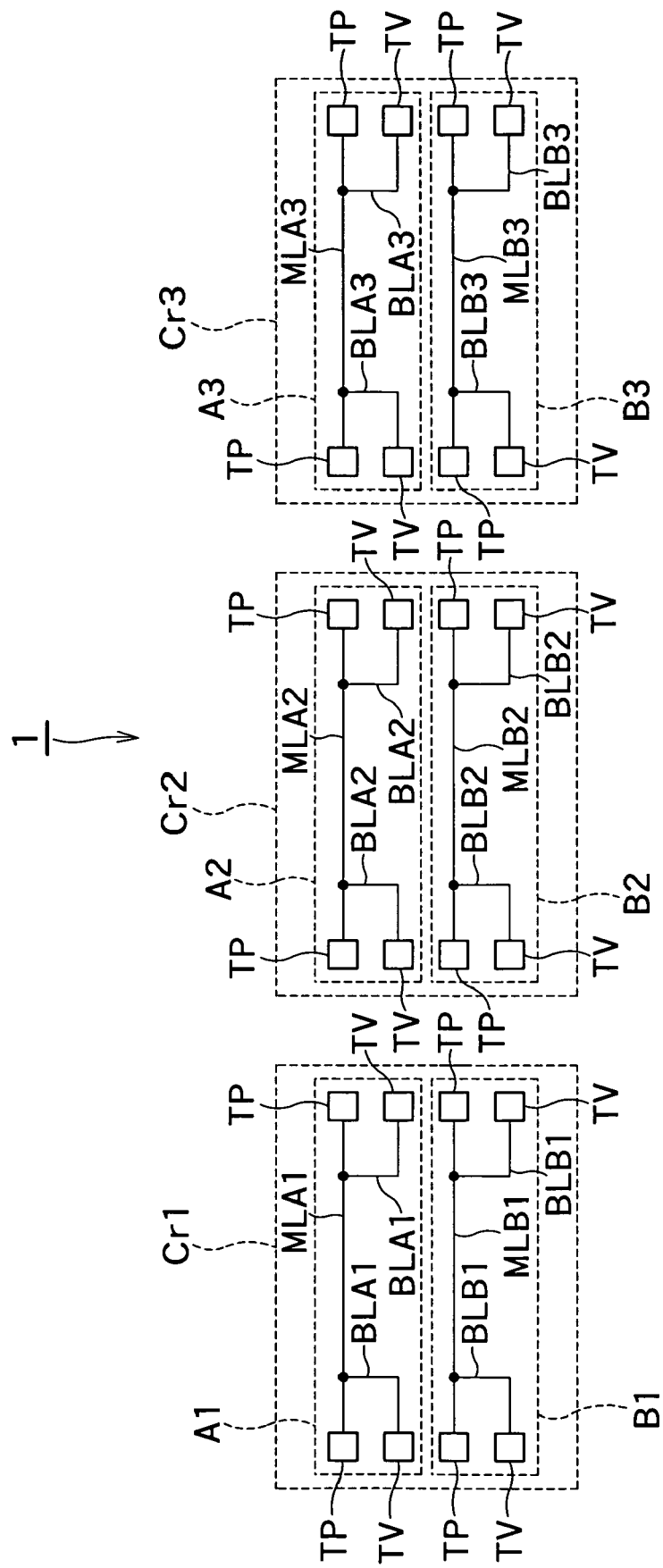
FIG. 1 is a circuit diagram showing an evaluation circuit arrangement used for a first embodiment of the present invention.

FIG. 1 is a circuit diagram showing an evaluation circuit arrangement used for a first embodiment of the present invention. The circuit arrangement 1 shown in the figure is provided with circuit groups Cr1, Cr2, Cr3 including two 4-terminal circuits (A1, B1), (A2, B2), (A3, B3) respectively. The 4-terminal circuit is constructed of known 4-terminal circuits A1 to A3 and 4-terminal circuits B1 to B3 which are characteristic of this embodiment. The 4-terminal circuits A1 to A3 include wiring MLA1 to MLA3 having a length of D formed of a conductive layer on a substrate or base layer S (see FIGS. 3A to 3C), power supply terminals TP provided at both ends of the wiring and voltage measuring terminals TV connected to the wiring MLA1 to MLA3 through shunt lines BLA1 to BLA3. Insulating films IS (see FIGS. 2A to 2C and FIGS. 3A to 3C) are formed in at least areas peripheral to the respective wiring and terminals. Likewise, the 4-terminal circuits B1 to B3 include wiring MLB1 to MLB3 having a length of D formed of a conductive layer, power supply terminals TP provided at both ends of the wiring and voltage measuring terminals TV connected to the wiring MLB1 to MLB3 through shunt lines BLB1 to BLB3. The respective wiring widths are formed so as to be equal inside the respective circuit groups Cr1, Cr2, Cr3 and so as to differ from one circuit group to another. In this embodiment, wiring widths are formed in such a way as to increase in order of Cr1, Cr2, and Cr3.

On the wiring MLB1 to MLB3 of the 4-terminal circuits B1 to B3, a hole pattern HPb which is a pattern to be evaluated is arranged from right above each part of the wiring up to each part of the wiring, which locally removes the wiring MLB1 to MLB3. This aspect will be explained more specifically with reference to FIGS. 2A to 2C and FIGS. 3A to 3C.

Figure 2A:
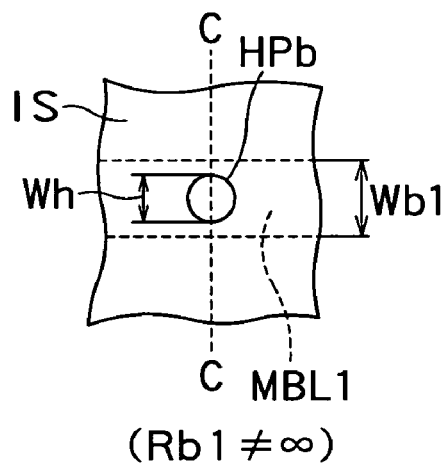
FIGS. 2A to 2C are partially enlarged views of wiring with a pattern to be evaluated out of the wiring of the evaluation circuit arrangement shown in FIG. 1.
Figure 2B:
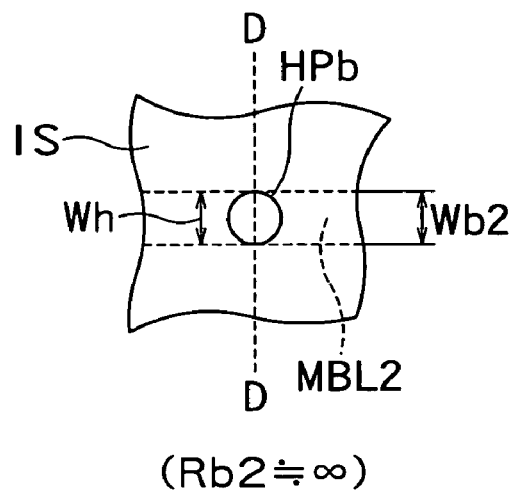
Figure 2C:
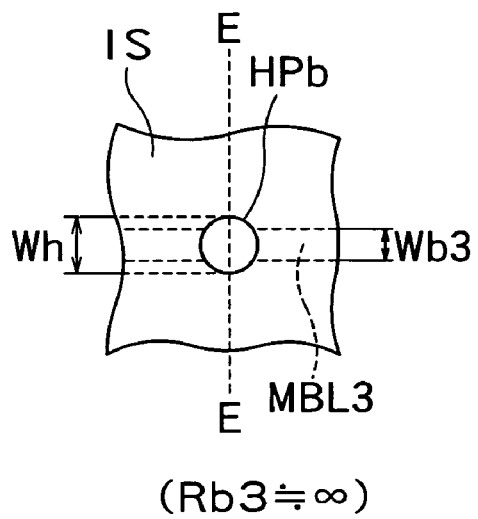
Figure 3A:
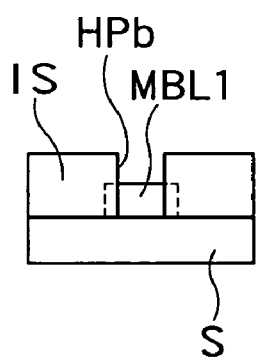
FIGS. 3A to 3C are sectional views of the wiring part shown in FIGS. 2A to 2C.
Figure 3B:
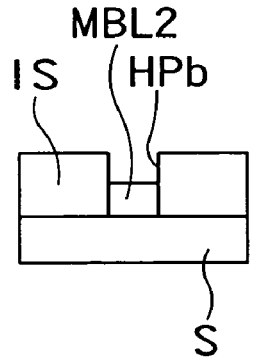
Figure 3C:
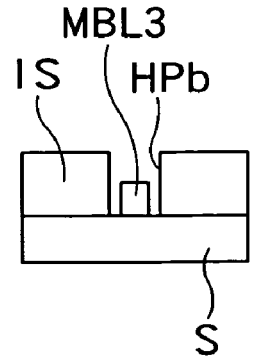

FIGS. 2A to 2C are enlarged plan views of parts of the wiring MLB1 to MLB3 of the 4-terminal circuits B1 to B3 where hole patterns HPb are arranged. FIG. 2A is a partially enlarged view of the wiring MLB1, FIG. 2B is a partially enlarged view of the wiring MLB2 and FIG. 2C is a partially enlarged view of the wiring MLB3. FIGS. 3A to 3C are sectional views along cutting lines C-C, D-D, E-E of the respective wiring parts shown in FIGS. 2A to 2C.

As shown in FIG. 2A, the wiring width Wb1 of the wiring MBL1 of the 4-terminal circuit B1 exceeds the hole width Wh of the hole pattern HPb. The wiring width Wb2 of the wiring MBL2 of the 4-terminal circuit B2 is substantially the same as the hole width Wh of the hole pattern HPb. Furthermore, the wiring width Wb3 of the wiring MBL3 of the 4-terminal circuit B3 falls short of the hole width Wh of the hole pattern HPb. The wiring widths Wb1, Wb2, Wb3 of the wiring MLB1 to MLB3 are formed to be substantially equal to the widths of the wirings MLA1 to MLA3 of the wiring 4-terminal circuits A1 to A3. Therefore, by measuring the wiring widths of the wiring MLA1 to MLA3, the wiring widths Wb1, Wb2, Wb3 of the wiring MLB1 to MLB3 can be calculated. The wiring widths of the wiring MLB1 to MLB3 can be electrically calculated using a known method, for example:

$$W = \rho s \cdot D \cdot T \cdot I/V \quad \text{Expression (1)}$$

where T is the film thickness of a conductive layer, ρs is a volume resistivity and D is a length.

Figure 4:
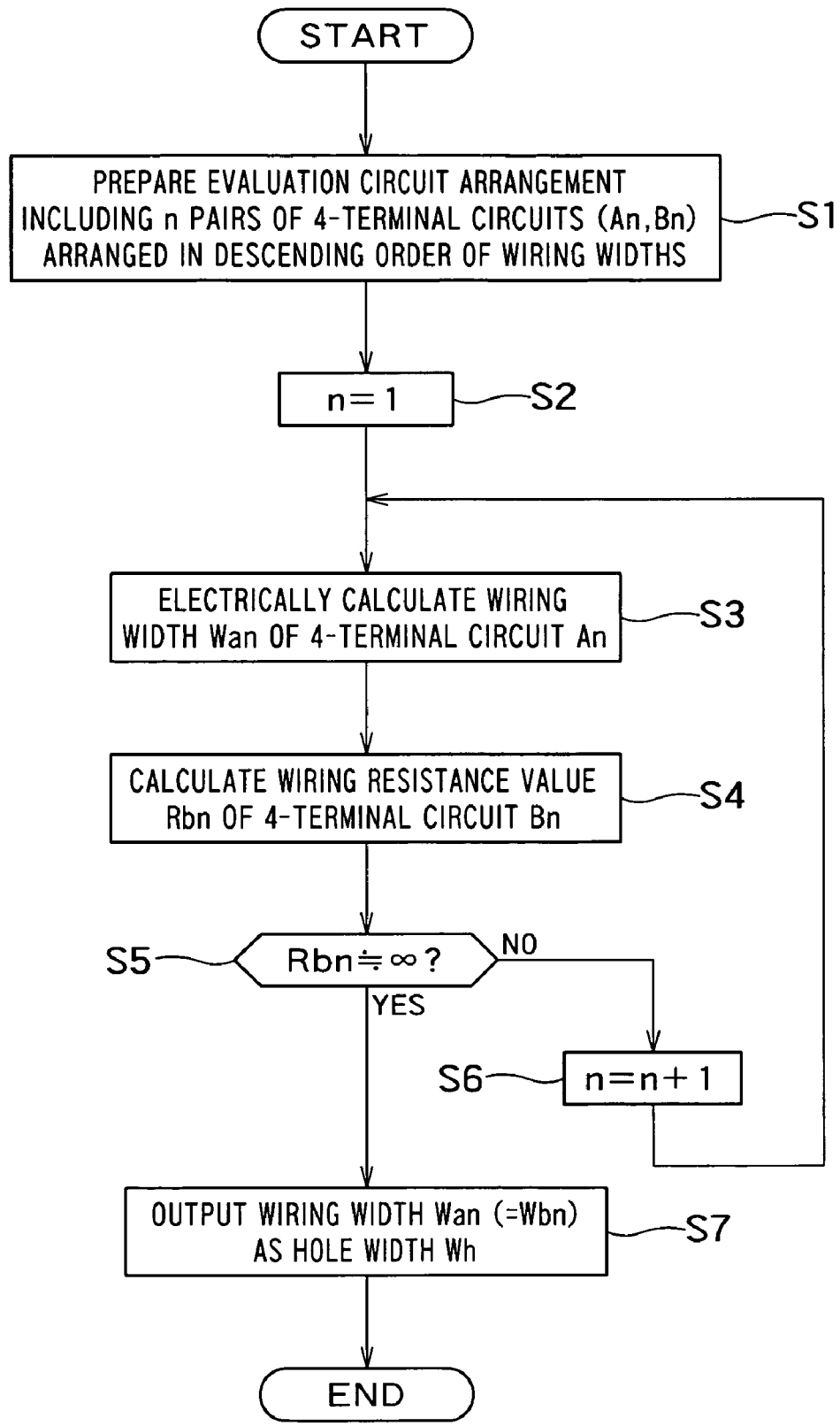
FIG. 4 is a flow chart illustrating a schematic procedure of the pattern evaluation method according to the first embodiment of the present invention.
Figure 5:
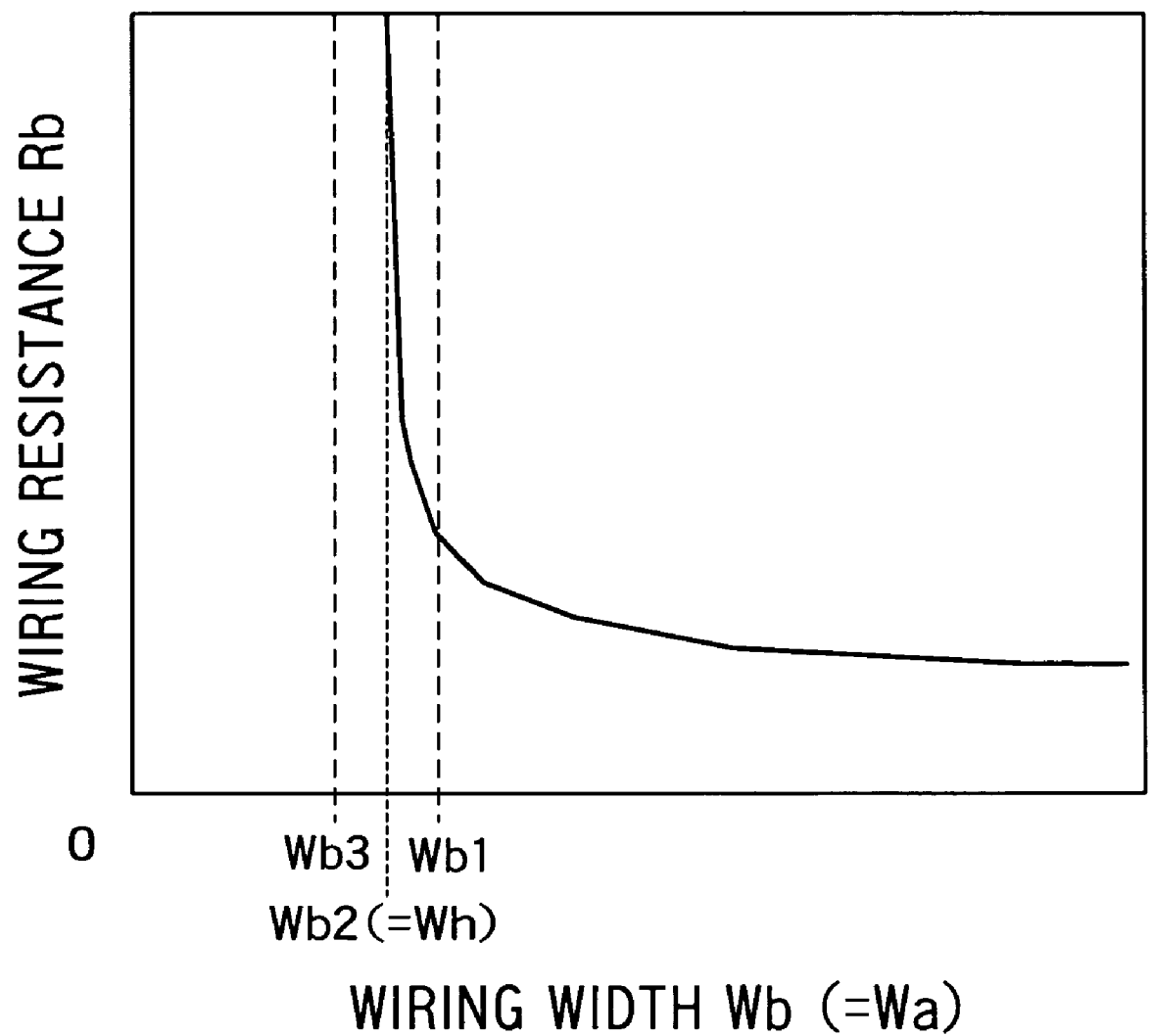
FIG. 5 is a graph illustrating the pattern evaluation method shown in FIG. 4.

The pattern evaluation method using the circuit arrangement 1 shown in FIG. 1 will be explained with reference to FIG. 4 and FIG. 5.

First, a circuit arrangement 1 is prepared (step S1), n=1 is set (step S2), a power supply and voltmeter are connected to the 4-terminal circuit A1 (An, (n=1)) and a wiring width Wa1 (Wan, (n=1)) of the wiring MLA1 is electrically calculated using, for example, Expression (1) (step S3). Here, it is important to electrically calculate the wiring width Wa1 and in calculating the wiring width Wa1 and a correction term may be provided for Expression (1) above or another expression may also be used.

Then, a power supply and voltmeter are likewise connected to the 4-terminal circuit B1 (Bn, (n=1)) and the wiring resistance Rb1 of the wiring MLB1 of the 4-terminal circuit B1 is calculated according to R=I/V (step S4). At this time, the characteristic value of the 4-terminal circuit Bn changes depending on a geometric relationship between the wiring MLB1 to MLB3 and hole pattern HPb. More specifically, since the wiring pattern of each wiring part is locally removed through the hole pattern HPb formed up to each wiring part from right above each wiring part, the following relationships are held between the wiring width Wbn and wiring resistance Rbn of each wiring part:

$$\text{If } Wbn \leq Wh, Rbn \approx \infty \quad \text{Expression (2)}$$

$$\text{If } Wbn > Wh, Rbn \neq \infty \quad \text{Expression (3)}$$

Therefore, returning to FIG. 4, the above described measuring procedure is repeated in descending order of thickness of the wiring width (steps S6, S3 to S5), the wiring width Wan (Wbn) when wire breakage occurs for the first time due to the hole pattern HPb, that is, when Rbn≈∞ (see FIG. 2B) can be output as the hole width Wh of the hole pattern HPb (step S8). In this embodiment, as shown in FIG. 5, Rb2≈∞ for the first time in the 4-terminal circuit B2 in the circuit group Cr2 and the wiring width Wa2 (Wb2) at this time is output as the hole width Wh of the hole pattern HPb.

In this embodiment, three types of wiring width are measured taking three circuit groups Cr1 to Cr3 for simplicity of explanation, but types of wiring width are not limited to this and it goes without saying that setting the wiring width so as to cover more types of wiring width allows measurement of hole width with higher accuracy.

(2) SECOND EMBODIMENT

Figure 6:
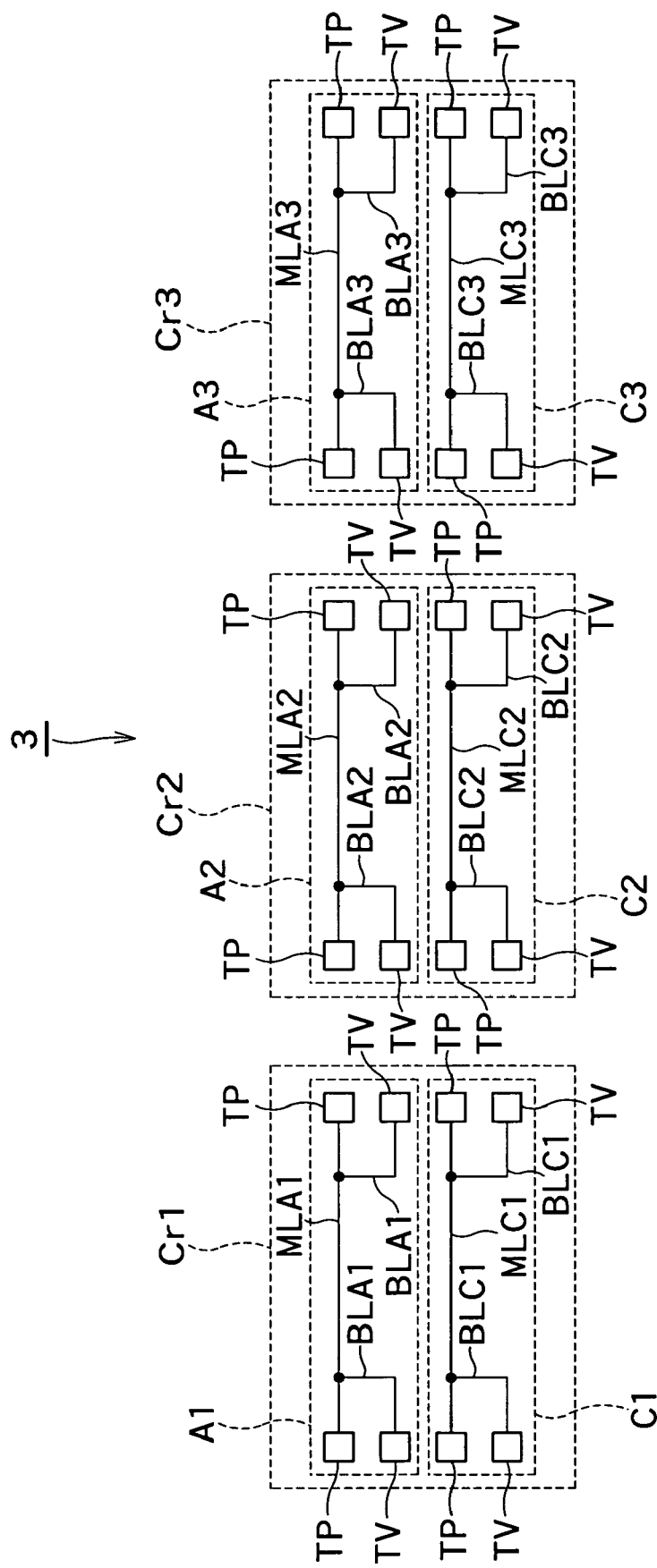
FIG. 6 is a circuit diagram showing an evaluation circuit arrangement used in a second embodiment of the present invention.

FIG. 6 is a circuit diagram showing an evaluation circuit arrangement used in a second embodiment of the present invention. The circuit arrangement 3 shown in the figure is provided with circuit groups Cr1, Cr2, Cr3 including two 4-terminal circuits (A1, C1, (A2, C2), (A3, C3) respectively. Wiring MLC1 to MLC3 of the 4-terminal circuits C1 to C3 are arranged in ascending order of thickness in this embodiment. Furthermore, a pair of hole patterns HPc1, HPc2 which are axisymmetric with respect to the center line of each wiring part are arranged in the vicinity of edges of the wiring MLC1 to MLC3 and it is the interval between these hole patterns HPc1, HPc2 that constitutes a characteristic value of a pattern to be evaluated in this embodiment.

Figure 7A:
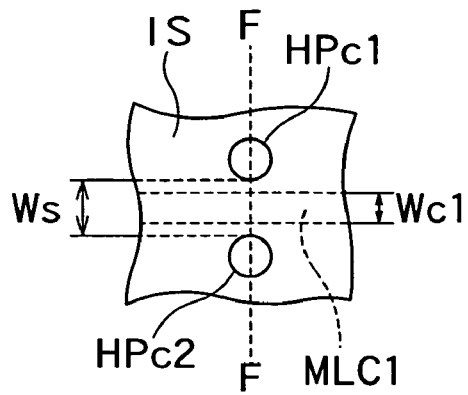
FIGS. 7A to 7C are partially enlarged views of wiring with a pattern to be evaluated out of the wiring of the evaluation circuit arrangement shown in FIG. 6.
Figure 7B:
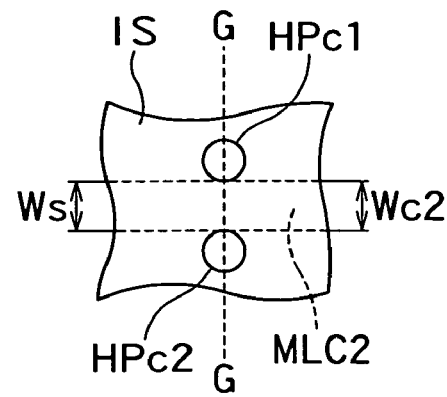
Figure 7C:
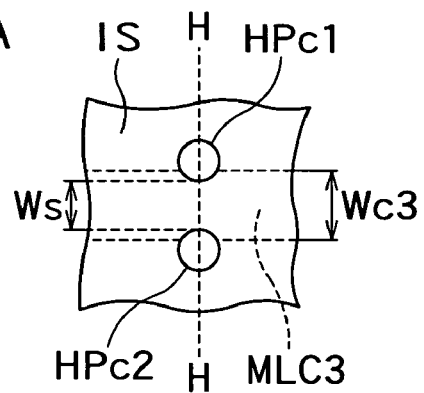
Figure 8A:
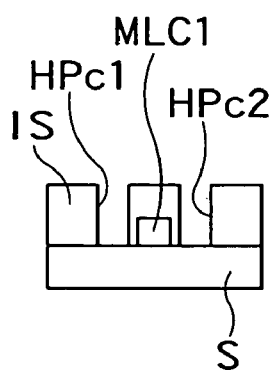
FIGS. 8A to 8C are sectional views of the wiring part shown in FIGS. 7A to 7C.
Figure 8B:
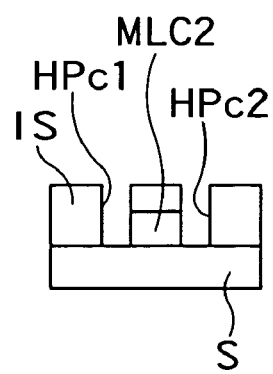
Figure 8C:
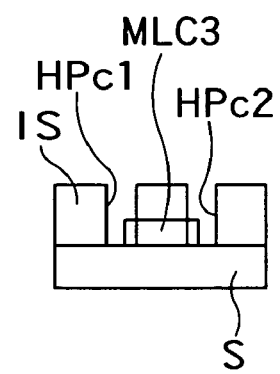

FIGS. 7A to 7C are enlarged plan views of parts where the hole patterns HPc1, HPc2 are arranged out of the wiring MLC1 to MLC3 of the 4-terminal circuits C1 to C3. FIG. 7A is a partially enlarged view of the wiring MLC1, FIG. 7B is a partially enlarged view of the wiring MLC2 and FIG. 7C is a partially enlarged view of the wiring MLC3. FIGS. 8A to 8C are sectional views along cutting lines F-F, G-G, H-H of the respective parts shown in FIGS. 7A to 7C.

As shown in FIG. 7A, the wiring width Wc1 of the wiring MCL1 of the 4-terminal circuit C1 falls short of the interval Ws between the hole patterns HPc1, HPc2. The wiring width Wc2 of the wiring MCL2 of the 4-terminal circuit C2 is substantially the same as the interval Ws between the hole patterns HPc1, HPc2. Furthermore, the wiring width Wc3 of the wiring MCL3 of the 4-terminal circuit C3 exceeds the interval Ws between the hole patterns HPc1, HPc2. As in the case of the above described first embodiment, the wiring widths Wc1, Wc2, Wc3 of the wiring MLC1 to MLC3 are formed so as to be equal to the wiring MLA1 to MLA3 of the wiring 4-terminal circuits A1 to A3. The rest of the configuration of the circuit arrangement 3 is substantially the same as the circuit arrangement 1 shown in FIG. 1.

The pattern evaluation method using the circuit arrangement 3 shown in FIG. 6 will be explained with reference to FIG. 9 and FIG. 10.

First, the circuit arrangement 3 shown in FIG. 6 is prepared (step S11), n=1 is set (step S12), a power supply and voltmeter are connected to the 4-terminal circuit A1 (An,(n=1)), the wiring width Wa1(Wan,(n=1)) of the wiring MLA1 is electrically calculated, for example, using Expression (1) and in this embodiment, the wiring resistance Ra1 (Ran,(n=1)) of the wiring MLA1 is also calculated from I/V (step S13).

Next, a power supply and voltmeter are likewise connected to the 4-terminal circuit C1 (Cn, (n=1)) and the wiring resistance Rc1 of the wiring MLC1 of the 4-terminal circuit C1 is calculated according to R=I/V (step S14). At this time, there is a mixture of wiring MLCn which is unaffected by a hole pattern HPc and wiring MLCn locally removed along the hole pattern HPc according to the relationship between the interval between the hole patterns HPc1, HPc2 formed at an edge in the vicinity of each wiring part MLCn and the wiring width of each wiring part. For example, in the case of the wiring MCL1 shown in FIG. 7A, since the wiring width Wc1 falls short of the interval Ws between the hole patterns HPc1, HPc2, it is unaffected at all and the resistance value Rc1 remains the same as the wiring MLA1. In the case of the wiring MCL2 shown in FIG. 7B, too, the wiring width Wc2 is substantially equal to the interval Ws between the hole patterns HPc1, HPc2, it is unaffected by the hole pattern arrangement and the resistance value Rc2 also remains the same as the wiring MLA2. On the other hand, in the case of the wiring MCL3 shown in FIG. 7C, the wiring width Wc3 exceeds the interval Ws between the hole patterns HPc1, HPc2, and therefore part of the wiring in the vicinity of edges is locally removed, with the result that the resistance value Rc3 exceeds the resistance value Ra3 of the wiring MLA3. That is, the following relationships are held between the wiring width Wcn of each wiring part and the interval Ws between the hole patterns:

If $Wcn \leq Ws$, $Rcn \approx Ran(Ran/Rcn \approx 1)$      Expression (4)

If $Wcn > Ws$, $Rcn > Ran(Ran/Rcn < 1)$      Expression (5)

Returning to FIG. 9, the wiring resistance Ra1 of the wiring MLA1 and the wiring resistance Rc1 of the wiring MLC1 are compared and above described steps S13 to S15 are repeated until Ran/Rcn<1 (step S16). As a result, the wiring width Wc (n−1) (=) Wa (n−1)) of the wiring MLA (n−1) of the immediately preceding circuit group when Ran/Rcn<1 for the first time is output as the interval Ws between the hole patterns HPc1, HPc2 (step S17). In this embodiment, for example, as shown in the graph in FIG. 10, Ra3/Rc3<1 for the first time with the wiring MCL3, and therefore the wiring width Wc2 of the immediately preceding wiring MCL2 is output as the interval Ws.

As in the case of the above described first embodiment, this embodiment has also performed measurement with three types of wiring width, but types of wiring width are not limited to this, and it is possible to measure the length of an interval between hole patterns with higher accuracy if the wiring width is set finely so as to increase the number of types.

(3) THIRD EMBODIMENT

Figure 11:
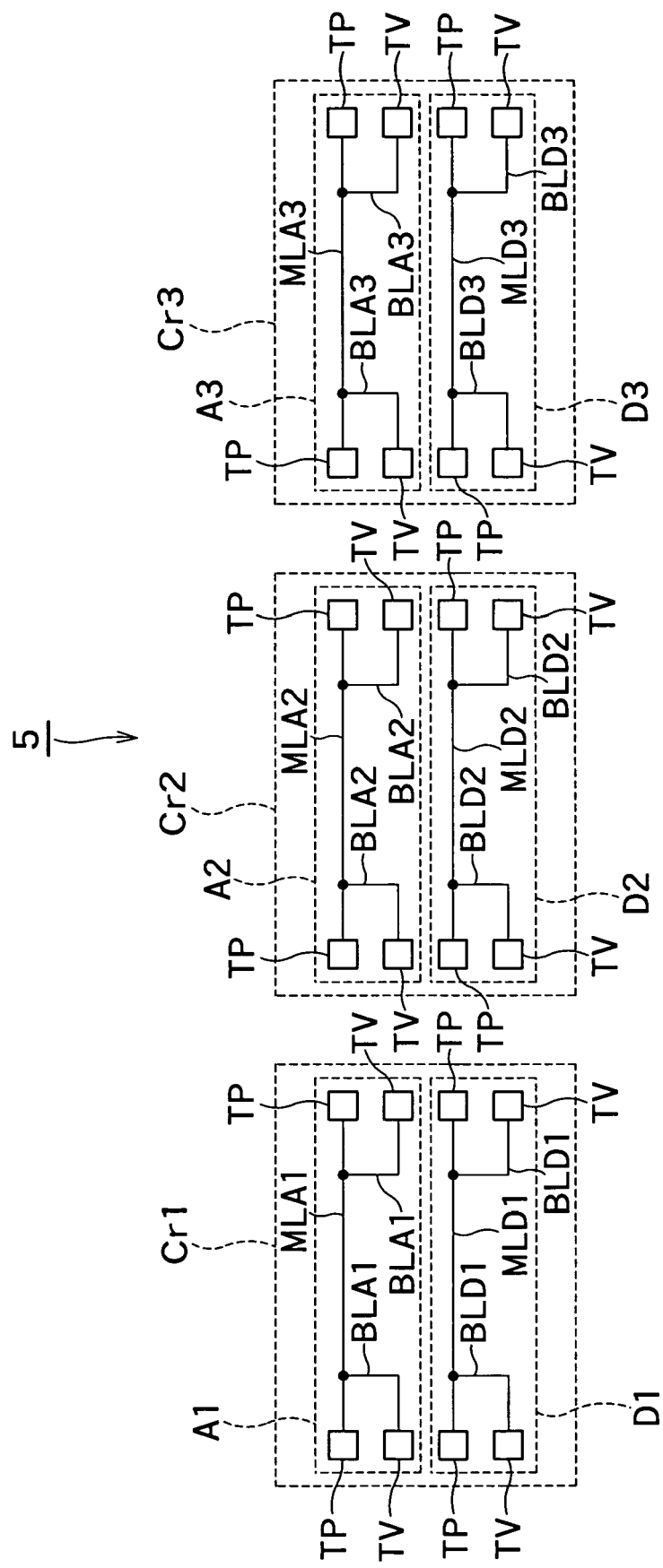
FIG. 11 is a circuit diagram showing an evaluation circuit arrangement used in a third embodiment of the present invention.

FIG. 11 is a circuit diagram showing an evaluation circuit arrangement used in a third embodiment of the present invention. The circuit arrangement 5 shown in the figure is provided with circuit groups Cr1, Cr2, Cr3 including two 4-terminal circuits (A1, D1), (A2, D2), (A3, D3) respectively. In this embodiment, the wiring MLD1 to MLD3 of the 4-terminal circuits D1 to D3 are arranged in descending order of thickness as in the case of the above described first embodiment.

In this embodiment, hole patterns HPd which are patterns to be evaluated are arranged to even reach an interface with the substrate or base layer S not right above the respective wiring parts of the 4-terminal circuits D1 to D3 but with a position shift by a predetermined amount of SF intentionally produced on the wiring MLD1 to MLD3, whereby the wiring MLD1 to MLD3 are locally removed. This aspect will be explained more specifically with reference to FIGS. 12A to 12C.

Figure 12A:
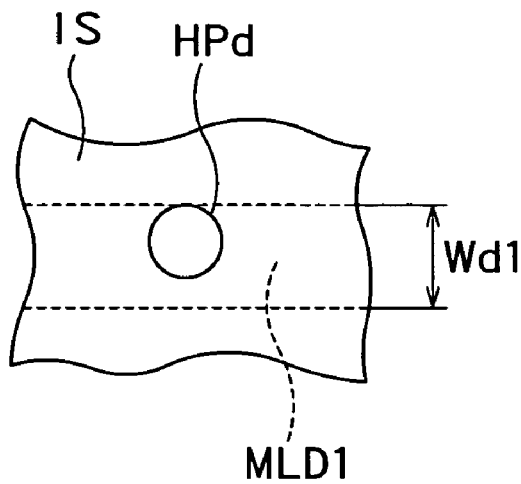
FIGS. 12A to 12C are partially enlarged views of wiring with a pattern to be evaluated out of the wiring of the evaluation circuit arrangement shown in FIG. 11.
Figure 12B:
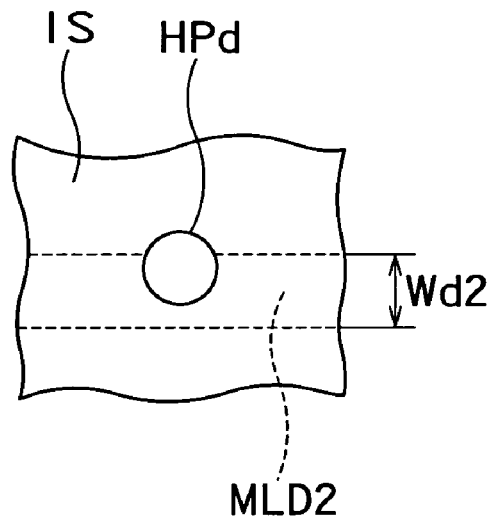
Figure 12C:
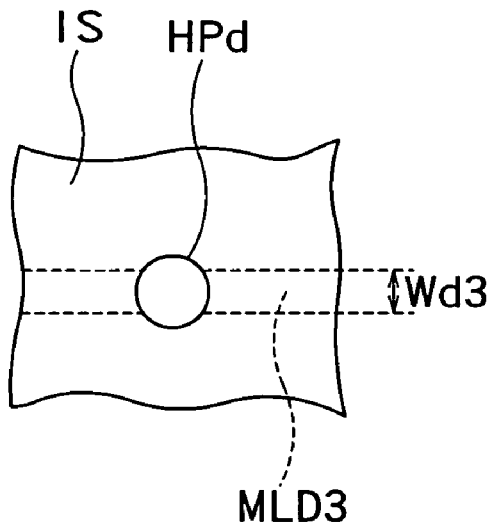

FIGS. 12A to 12C are enlarged plan views of parts of the wiring MLD1 to MLD3 of the 4-terminal circuits D1 to D3 where hole patterns HPd are arranged. FIG. 12A is a partially enlarged view of the wiring MLD1, FIG. 12B is a partially enlarged view of the wiring MLD2 and FIG. 12C is a partially enlarged view of the wiring MLD3. As is evident from a comparison with FIGS. 2A to 2C, the hole pattern HPd is arranged shifted upward on the surface of the sheet in this embodiment, and therefore wire breakage occurs with the wiring MLD3 of the finer wiring width Wd3 for the first time.

Figure 13:
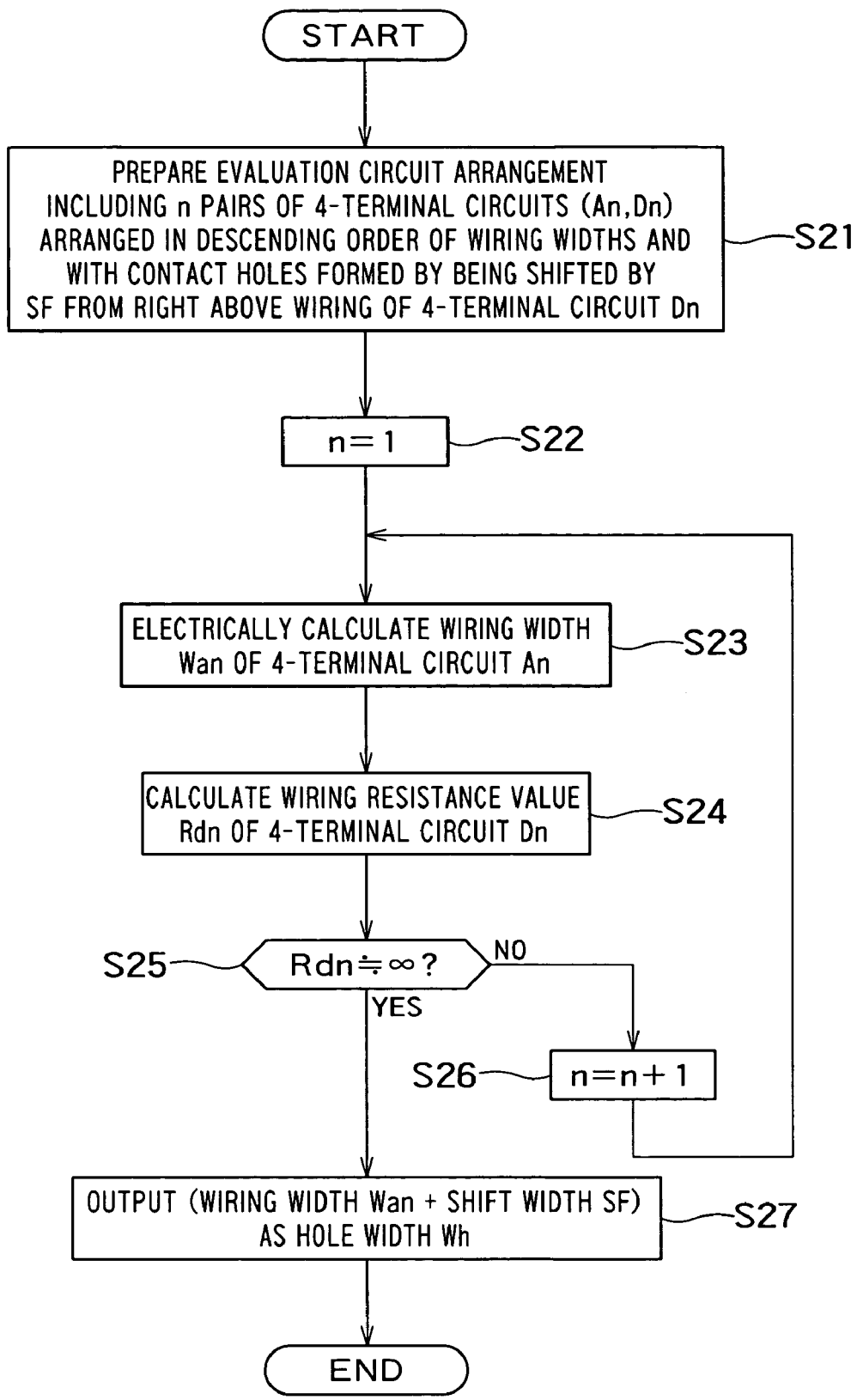
FIG. 13 is a flow chart illustrating a schematic procedure of the pattern evaluation method according to the third embodiment of the present invention.

FIG. 13 is a flow chart illustrating a schematic procedure of the pattern evaluation method according to this embodiment. This series of steps is substantially equal to the procedure shown in FIG. 4 except step S21 to prepare the evaluation circuit arrangement 5 and step S27 to finally output hole widths and in step S27, a value obtained by adding a shift width SF to a wiring width Wan of a wiring MLDn for which $Rdn \approx \infty$ for the first time is output as a hole width Wh.

Figure 14:
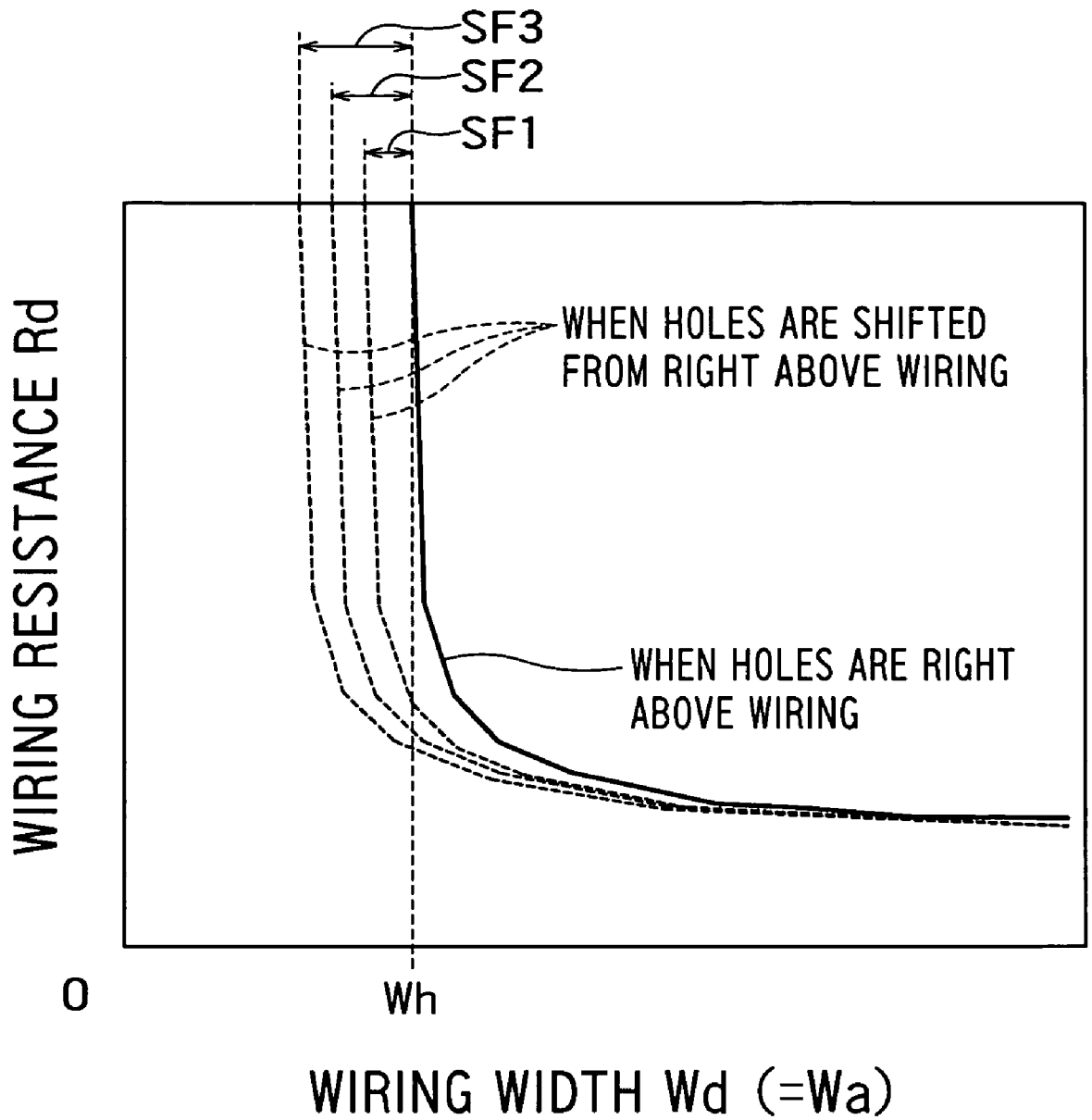
FIG. 14 is a graph illustrating the pattern evaluation method shown in FIG. 13.

When the hole pattern is arranged by being intentionally shifted from the position right above the wiring in this embodiment, as shown in the graph in FIG. 14, the wiring width for which $Rdn \approx \infty$ occurs for the first time becomes narrower by an amount of shift SF1 to SF3 compared to the case where the hole pattern is arranged right above the wiring.

According to this embodiment, even if, for example, a shift is produced due to the accuracy of a photolithography machine, it is possible to carry out dimensional measurement without concern for alignment shift if the amount of shift can be known.

(4) FOURTH EMBODIMENT

This embodiment provides a method to calculate an interval between patterns width in the case where a pair of patterns are provided in the vicinity of edges of wiring so as to sandwich the wiring according to the above described second embodiment when the pair of patterns are arranged by intentionally producing a predetermined amount of positional shift.

Figure 15:
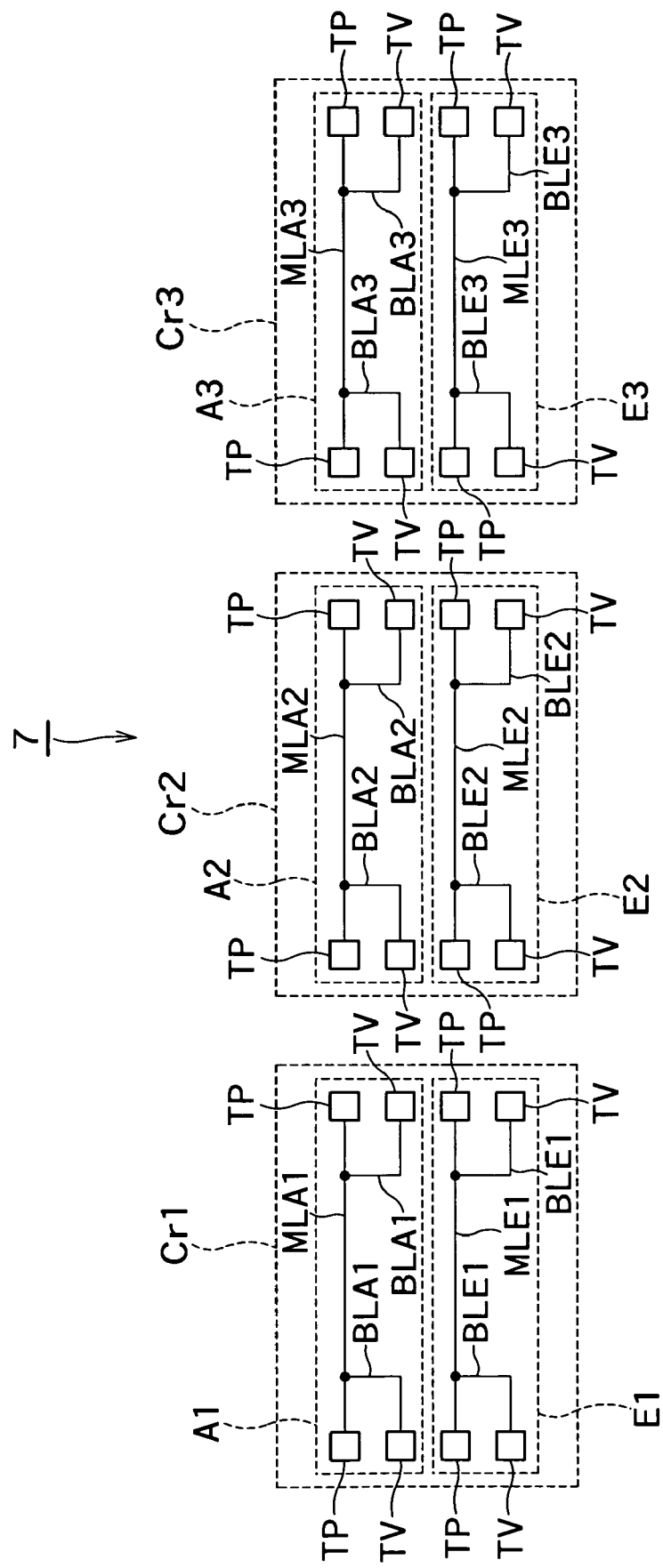
FIG. 15 is a circuit diagram showing an evaluation circuit arrangement used in a fourth embodiment of the present invention.
Figure 16A:
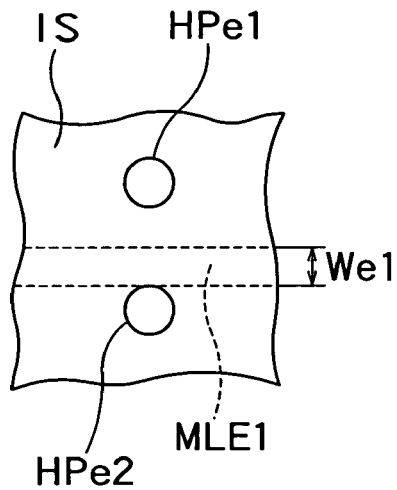
FIGS. 16A to 16C are partially enlarged views of wiring with a pattern to be evaluated out of the wiring of the evaluation circuit arrangement shown in FIG. 15.
Figure 16B:
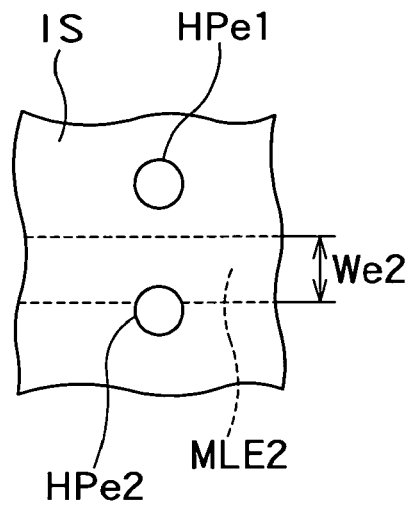
Figure 16C:
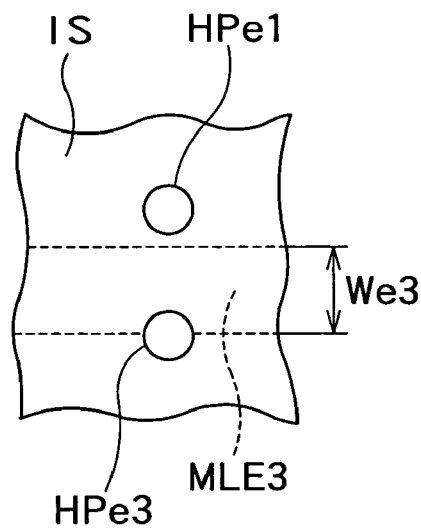

The circuit diagram of the evaluation circuit arrangement used in this embodiment is shown in FIG. 15. The circuit arrangement 7 shown in the figure is provided with circuit groups Cr1, Cr2, Cr3 including two 4-terminal circuits (A1, E1), (A2, E2), (A3, E3) respectively. In this embodiment, the wiring MLE1 to MLE3 of the 4-terminal circuits E1 to E3 are arranged in ascending order of thickness a. Furthermore, hole patterns HPe1, HPe2 are arranged in pairs so as to sandwich the wiring in the vicinity of edges of the wiring MLE1 to MLE3, but as shown in partially enlarged plan views of FIGS. 16A to 16C, the hole patterns HPe1, HPe2 are arranged by being shifted upward by an amount of shift SF from the center line of each wiring part on the surface of the sheet.

Thus, when the pair of hole patterns HPe1, HPe2 sandwiching the wiring are arranged with a predetermined amount of positional shift, as is evident from a comparison between the partially enlarged views in FIGS. 7A to 7C and the sectional views in FIGS. 8A to 8C, it is known that Ran/Ren<1 occurs for the first time with a smaller wiring width.

Figure 17:
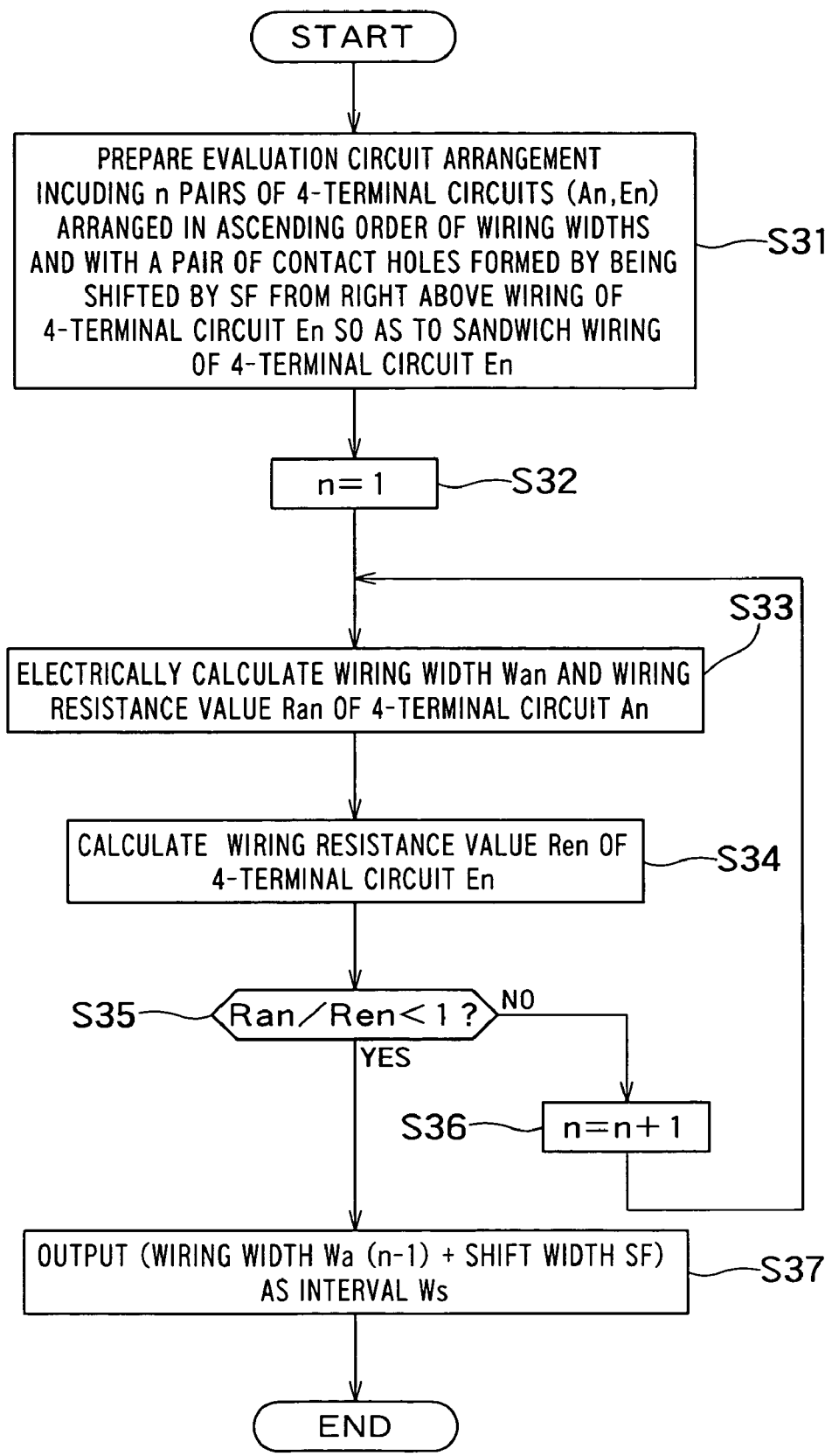
FIG. 17 is a flow chart illustrating a schematic procedure of the pattern evaluation method according to the fourth embodiment of the present invention.

FIG. 17 is a flow chart illustrating a schematic procedure of the pattern evaluation method according to this embodiment.

Figure 9:
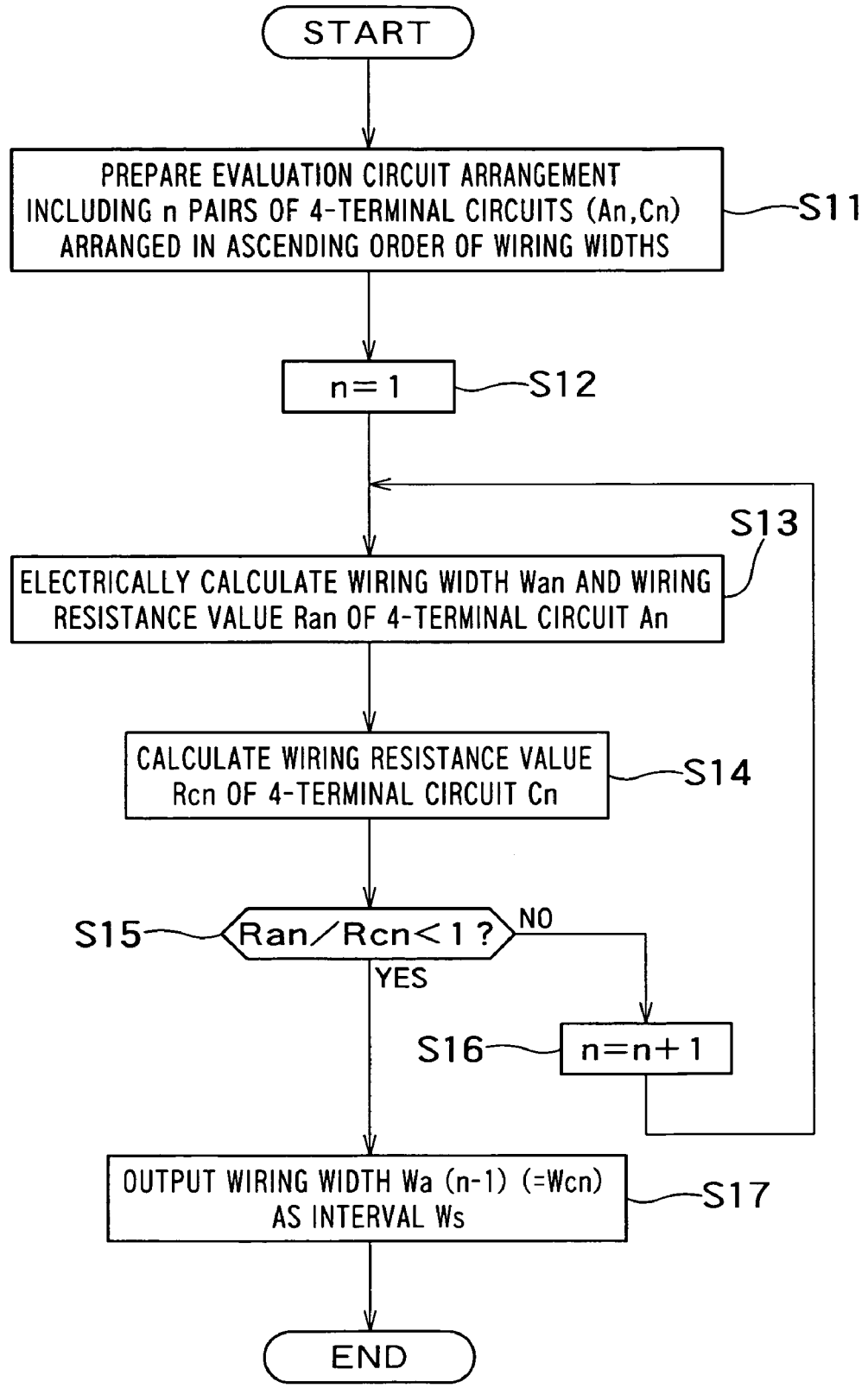
FIG. 9 is a flow chart illustrating a schematic procedure of the pattern evaluation method according to the second embodiment of the present invention.
Figure 10:
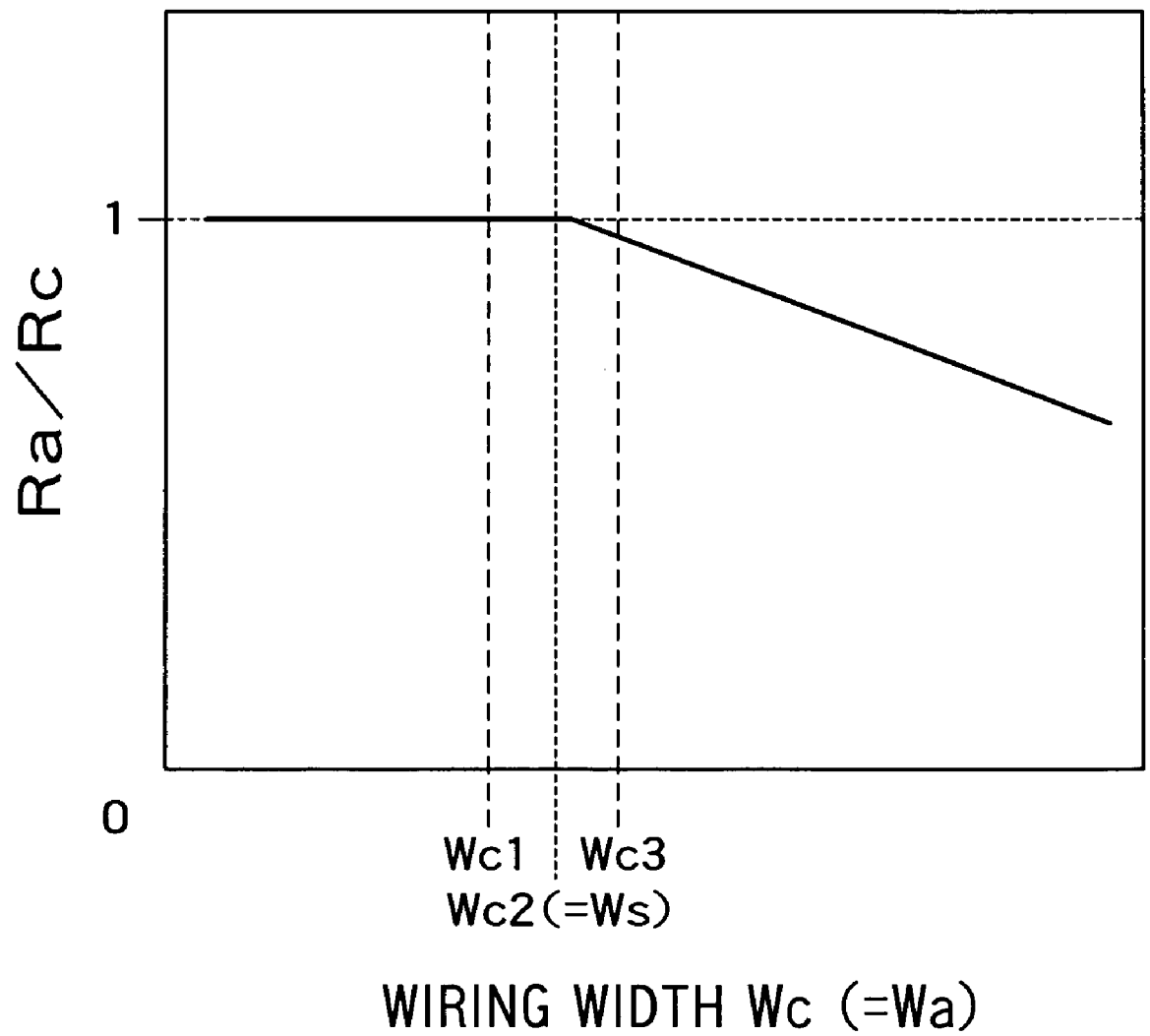
FIG. 10 is a graph illustrating the pattern evaluation method shown in FIG. 9.

A series of steps shown in FIG. 17 is substantially equal to the procedure shown in FIG. 9 except step S31 to prepare the evaluation circuit arrangement 7 and step S37 to finally output the interval of the hole patterns and a value obtained by adding a shift width SF to a wiring width Wa(n−1) of an immediately preceding wiring MLE(n−1) of a wiring MLEn for which Ran/Ren<1 occurs for the first time is output as an interval Ws between hole patterns (step S37).

Figure 18:
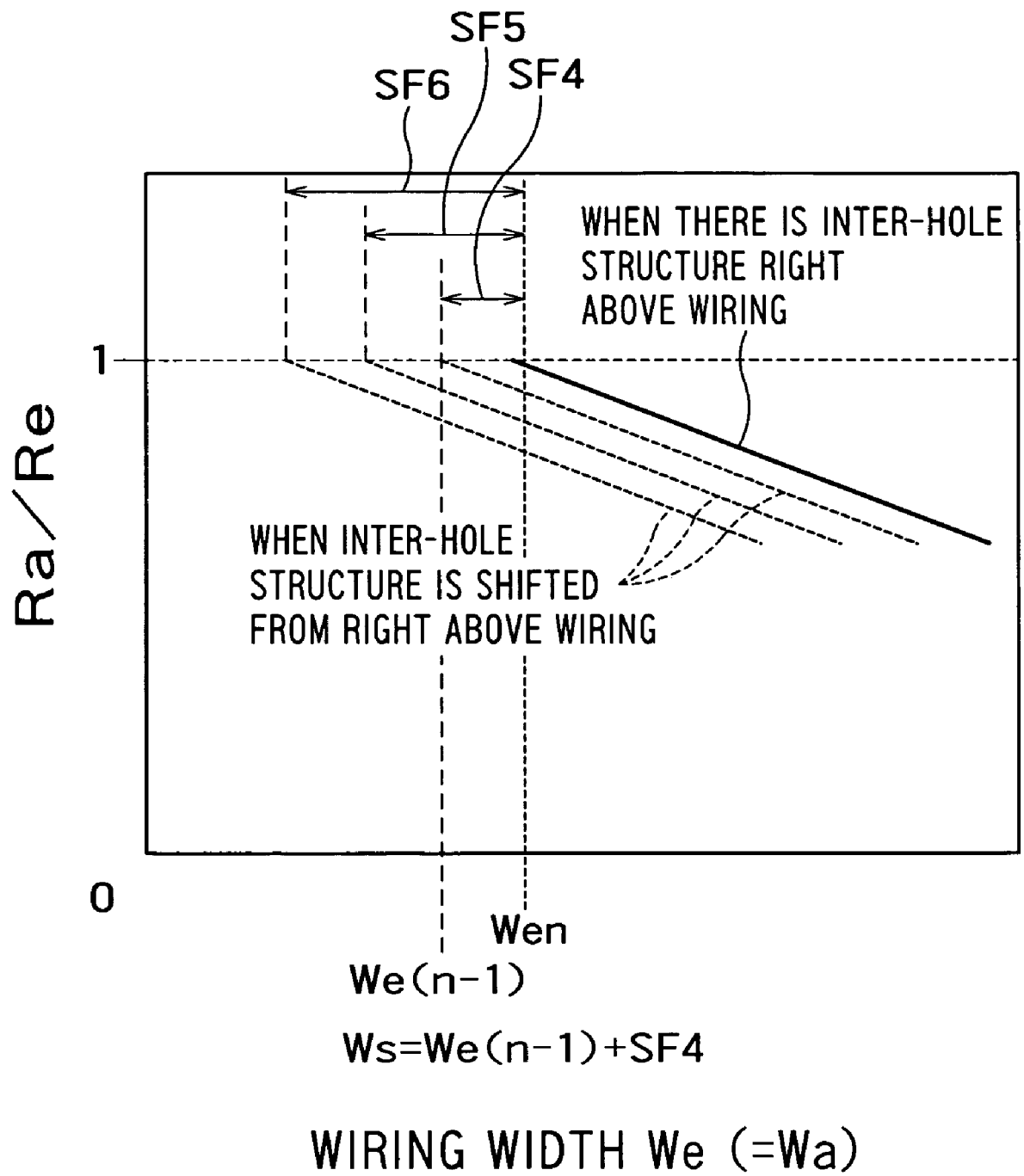
FIG. 18 is a graph illustrating the pattern evaluation method shown in FIG. 17.

As in the case of this embodiment, when the pair of hole patterns HPe1, HPe2 sandwiching the wiring are arranged by being intentionally shifted from the position right above the wiring, as shown in the graph in FIG. 18, the wiring width for which Ran/Ren<1 occurs for the first time becomes smaller by an amount of shift SF4 to SF6 compared to the case where they are arranged axisymmetrically with respect to the center line of the wiring.

As in the case of the aforementioned third embodiment, according to this embodiment, even if alignment shifts occur resulting from the accuracy of, for example, a photolithography machine, it is possible to carry out dimensional measurement without concern for the alignment shifts if only the amount of shift can be known.

(5) FIFTH EMBODIMENT

In the aforementioned third embodiment, when the amount of shift SF of the hall pattern is known, the hole width Wh of a pattern to be evaluated is calculated from the wiring width Wan of the wiring MLDn for which Rdn≈∞ occurs for the first time and the above described amount of shift SF. On the contrary, when the hole width Wh of the pattern to be evaluated is known, it is possible to calculate the amount of alignment shift of the pattern to be evaluated from the wiring width Wan of the wiring MLDn for which Rdn≈∞ for the first time and hole width Wh. This embodiment provides a method to electrically calculate an amount of alignment shift of a pattern to be evaluated HPd from right above the wiring.

Figure 19:
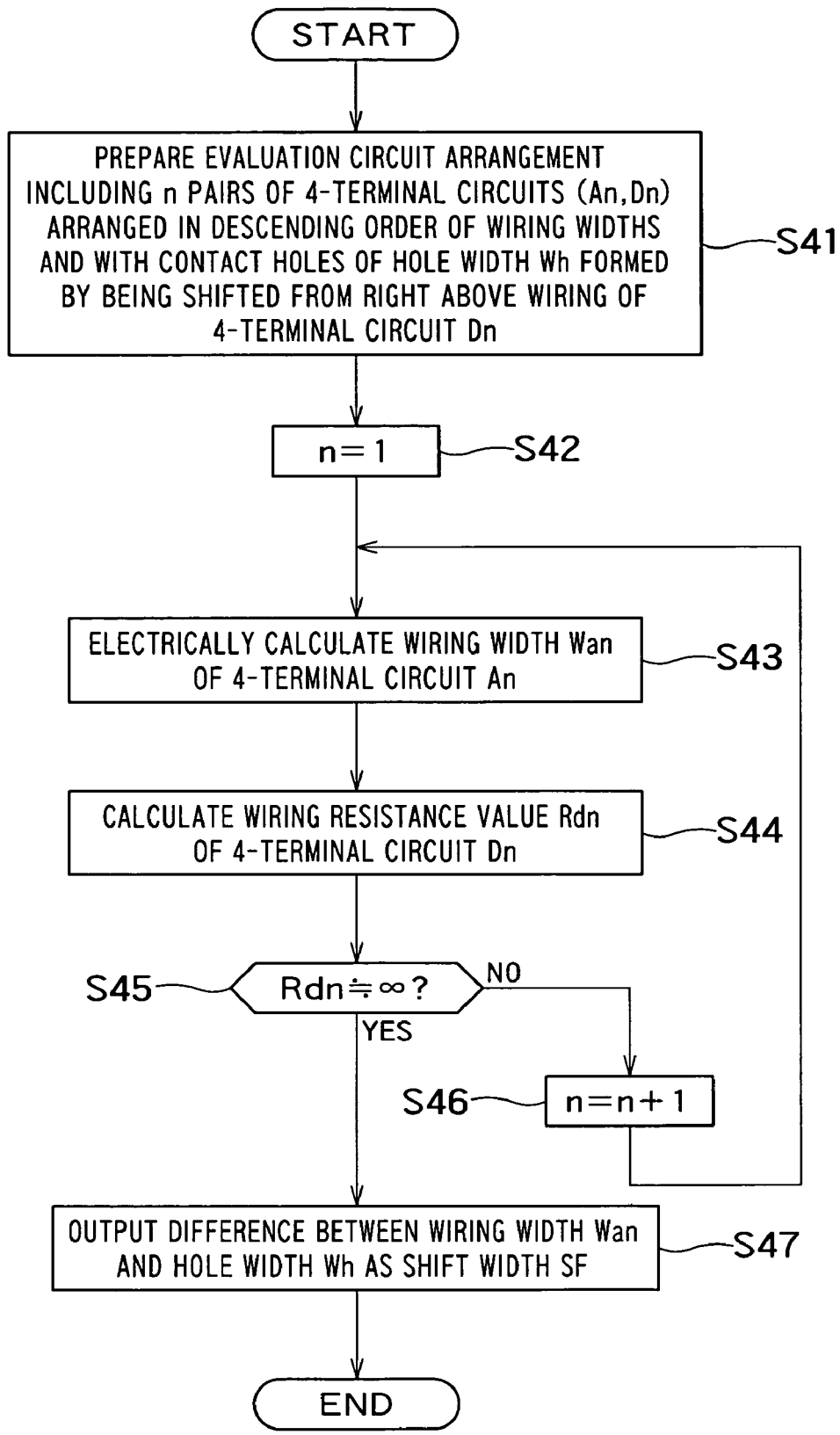
FIG. 19 is a flow chart illustrating a schematic procedure of a pattern evaluation method according to a fifth embodiment of the present invention.

A series of steps of the pattern evaluation method of this embodiment is shown in the flow chart in FIG. 19. As is evident from a comparison with the flow chart shown in FIG. 13, the respective steps are the same as those with 20 added to step numbers of the steps in FIG. 13 except steps S41 and S47. The evaluation circuit arrangement prepared in step S41 is the circuit arrangement 5 shown in FIG. 11, and what is different here from step S21 in FIG. 13 is that the amount of shift SF is unknown and hole width Wh is known. In final step S47, the difference between the wiring width Wan of the wiring MLDn for which Rdn≈∞ occurs for the first time and the hole width Wh is calculated and output as the shift width SF of the pattern to be evaluated HPd. In this embodiment, only the amount of shift SF from right above the wiring MLDn is output, but it is also possible to calculate many types of amounts of shift corresponding in number to additional 4-terminal circuits if 4-terminal circuits are provided in addition to the 4-terminal circuits An and Dn in the respective circuit groups Cr1 to Cr3.

(6) SIXTH EMBODIMENT

In the above described fourth embodiment, when an amount of shift SF of a pair of hole patterns HPe1, HPe2 is known, the interval Ws of the of hole patterns to be evaluated is calculated from the wiring width Wa (n−1) of the immediately preceding wiring MLE (n−1) of the wiring MLEn for which Ran/Ren<1 occurs for the first time and the above described amount of shift SF. On the contrary, if the interval Ws of the pattern to be evaluated is known, it is possible to calculate an amount of alignment shift from the wiring width Wa(n−1) of the immediately preceding wiring MLE(n−1) of the wiring MLEn for which Ran/Ren<1 occurs for the first time and the interval Ws. This embodiment provides a method to electrically calculate an amount of alignment shift from the center line of wiring of the patterns to be evaluated HPe1, HPe2.

Figure 20:
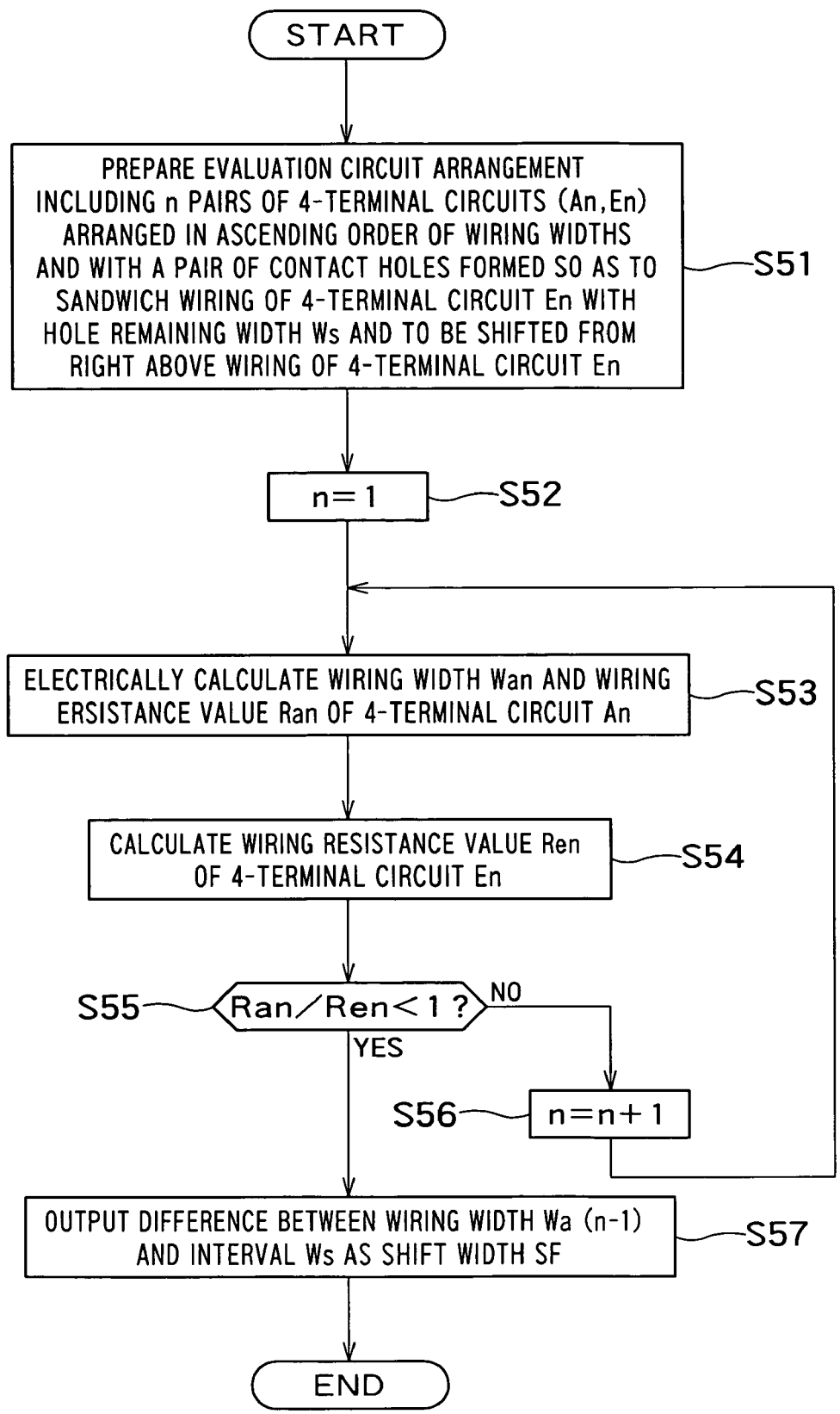
FIG. 20 is a flow chart illustrating a schematic procedure of a pattern evaluation method according to a sixth embodiment of the present invention.

A series of steps of the pattern evaluation method according to this embodiment is shown in the flow chart in FIG. 20. As is evident from a comparison with the flow chart in FIG. 17, the respective steps are the same as those with 20 added to step numbers of the steps in FIG. 17 except steps S51 and S57. The evaluation circuit arrangement prepared in step S51 can be the circuit arrangement 7 shown in FIG. 15, and what is different here from step S31 in FIG. 17 is that the amount of shift SF is unknown and the length of the interval Ws is known. In final step S57, the difference between a wiring width Wa(n−1) of wiring MLE(n−1) immediately preceding wiring MLEn for which Ran/Ren<1 occurs for the first time and the length of the interval Ws is calculated and output as a shift width SF of a pair of patterns to be evaluated HPe1, HPe2. In this embodiment, only the amount of shift SF from the center line of the wiring MLEn is output, but it is also possible to calculate many types of amounts of shift corresponding in number to additional 4-terminal circuits if 4-terminal circuits are provided in addition to the 4-terminal circuits An and En in the respective circuit groups Cr1 to Cr3.

(7) Correction Method of Mask Pattern, Manufacturing Method of Exposure Mask and Manufacturing Method of Semiconductor Device If a mask pattern is corrected using the pattern evaluation method according to the above described embodiment, it is possible to correct dimensional errors and position shifts of a pattern resulting from optical characteristics, etc., of a photolithography machine with high accuracy. By creating an exposure mask using the mask pattern corrected in this way, it is possible to reproduce a pattern which is faithful to a design pattern on a resist film and provide an exposure mask whose pattern shift can be corrected accurately. Therefore, using such an exposure mask in an exposure process in manufacturing processes of a semiconductor device makes it possible to manufacture the semiconductor device with high yield.

So far, embodiments of the present invention have been explained, but the present invention is not limited to the above described embodiments and can be implemented modified in various ways within the technological scope thereof. In the above described embodiments, a hole pattern HP is taken as an example of a pattern to be evaluated, but the present invention is not limited to this and it is also possible to measure dimensions of, for example, rectangular punched-out patterns like slits and the width of remaining parts between such punched-out patterns arranged on both sides of the wiring. Furthermore, in the above described second, fourth and fifth embodiments, hole patterns HP are arranged so as to be axisymmetric with respect to the center line of the wiring, but the present invention is not limited to this and it is also possible to arrange hole patterns and rectangular punched-out patterns around the wiring, for example, in a grid-like form. Furthermore, the above described embodiments have described the case with only two 4-terminal circuits in the same circuit group, but the present invention is not limited to this and if a circuit arrangement including all 4-terminal circuits An to En in each circuit group is provided, the above described pattern can be evaluated with a single circuit arrangement, and it is thereby possible to improve the evaluation efficiency drastically. Furthermore, the arrangement of the 4-terminal circuit in the evaluation circuit arrangement can also be changed arbitrarily according to the shape and arrangement of a pattern to be measured. Therefore, the procedure of the pattern evaluation method is not limited to the procedure shown in the flow chart in the attached drawings and can be changed according to required specifications, etc., of the evaluation circuit arrangement used and a final product as appropriate. Moreover, in the embodiment which electrically calculates an amount of shift, if the method is used together with an known measurement method of alignment shift, it is also possible to estimate an amount of positional shift in the pattern independently of the accuracy of alignment shift resulting from the accuracy of the photolithography machine. This is very effective in estimating an amount of positional shift resulting from the pattern due to additional processes which are often used in recent years, for example, asymmetric shrink of the pattern resulting from thermal flow and RELACS.

What is claimed is:

1. A pattern evaluation method using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, the pattern evaluation method comprising:
- arranging patterns to be evaluated so that the Mth wiring or a layer in the vicinity thereof is locally removed;
- electrically calculating a first characteristic value indicating a characteristic of the first circuit including at least the wiring width of the first wiring;
- electrically calculating an Mth characteristic value which is a value indicating the characteristic of the Mth circuit and dependent on a geometric relationship between the pattern to be evaluated and the Mth wiring; and
- evaluating the characteristic of the pattern to be evaluated based on the first characteristic value to the Mth characteristic value obtained for at least two circuit groups of the N circuit groups.

2. The pattern evaluation method according to claim 1, wherein the pattern to be evaluated is a closed-space pattern formed from above the Mth wiring up to the Mth wiring or a layer in the vicinity thereof,
- the Mth characteristic value is a wiring resistance value of the Mth circuit, and
- the evaluation includes outputting of the value of the finest wiring width out of the wiring widths with which the wiring resistance value of the Mth circuit becomes substantially 0 as the dimension of the closed-space pattern.

3. The pattern evaluation method according to claim 1, wherein the pattern to be evaluated is closed-space patterns formed in the vicinity of edges of the Mth wiring so as to form a pair sandwiching the Mth wiring in a plan view,
- the first characteristic value includes the width of the first wiring and the wiring resistance value of the first circuit,
- the Mth characteristic value is the wiring resistance value of the Mth circuit; and
- the evaluation includes calculating a length of an interval between the closed-space patterns from the ratio of the wiring resistance value of the first circuit and the wiring resistance value of the Mth circuit.

4. The pattern evaluation method according to claim 1, wherein the pattern to be evaluated is formed so as to shift from the center line of the Mth circuit by a predetermined amount of shift, and
- the evaluation includes correcting the characteristic of the pattern to be evaluated by the amount of shift.

5. The pattern evaluation method according to claim 1, wherein the pattern to be evaluated is a closed-space pattern in a predetermined size from above the Mth wiring up to the Mth wiring or a layer in the vicinity thereof,
- the Mth characteristic value is the wiring resistance value of the Mth circuit, and
- the evaluation includes calculating an amount of shift of the closed-space pattern by comparing the value of the finest wiring width out of the wiring width with which the wiring resistance value of the Mth circuit becomes substantially 0 with the size of the closed-space pattern.

6. The pattern evaluation method according to claim 1, wherein the pattern to be evaluated is closed-space patterns formed in the vicinity of edges of the Mth wiring, the closed-space patterns being set apart from each other by a predetermined interval so as to form a pair sandwiching the Mth wiring in a plan view,
- the first characteristic value includes the width of the first wiring and the wiring resistance value of the first circuit,
- the Mth characteristic value is the wiring resistance value of the Mth circuit, and
- the evaluation includes calculating an amount of shift of the closed-space patterns based on the length of the interval and the ratio of the wiring resistance value of the first circuit and the wiring resistance value of the Mth circuit.

7. A manufacturing method of a semiconductor device comprising a pattern evaluation method using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, the pattern evaluation method comprising:
- arranging patterns to be evaluated so that the Mth wiring or a layer in the vicinity thereof is locally removed;
- electrically calculating a first characteristic value indicating a characteristic of the first circuit including at least the wiring width of the first wiring;
- electrically calculating an Mth characteristic value which is a value indicating the characteristic of the Mth circuit and dependent on a geometric relationship between the pattern to be evaluated and the Mth wiring; and
- evaluating the characteristic of the pattern to be evaluated based on the first characteristic value to the Mth characteristic value obtained for at least two circuit groups of the N circuit groups.

8. The manufacturing method of a semiconductor device according to claim 7,
- wherein the pattern to be evaluated is a closed-space pattern formed from above the Mth wiring up to the Mth wiring or a layer in the vicinity thereof,
- the Mth characteristic value is a wiring resistance value of the Mth circuit, and
- the evaluation includes outputting of the value of the finest wiring width out of the wiring widths with which the wiring resistance value of the Mth circuit becomes substantially 0 as the dimension of the closed-space pattern.

9. The manufacturing method of a semiconductor device according to claim 7,
- wherein the pattern to be evaluated is closed-space patterns formed in the vicinity of edges of the Mth wiring so as to form a pair sandwiching the Mth wiring in a plan view,
- the first characteristic value includes the width of the first wiring and the wiring resistance value of the first circuit,
- the Mth characteristic value is the wiring resistance value of the Mth circuit; and
- the evaluation includes calculating a length of an interval between the closed-space patterns from the ratio of the wiring resistance value of the first circuit and the wiring resistance value of the Mth circuit.

10. The manufacturing method of a semiconductor device according to claim 7,
- wherein the pattern to be evaluated is formed so as to shift from the center line of the Mth circuit by a predetermined amount of shift, and
- the evaluation includes correcting the characteristic of the pattern to be evaluated by the amount of shift.

11. The manufacturing method of a semiconductor device according to claim 7,
- wherein the pattern to be evaluated is a closed-space pattern in a predetermined size from above the Mth wiring up to the Mth wiring or a layer in the vicinity thereof,
- the Mth characteristic value is the wiring resistance value of the Mth circuit, and the evaluation includes calculating an amount of shift of the closed-space pattern by comparing the value of the finest wiring width out of the wiring width with which the wiring resistance value of the Mth circuit becomes substantially 0 with the size of the closed-space pattern.

12. The manufacturing method of a semiconductor device according to claim 7,
wherein the pattern to be evaluated is closed-space patterns formed in the vicinity of edges of the Mth wiring, the closed-space patterns being set apart from each other by a predetermined interval so as to form a pair sandwiching the Mth wiring in a plan view,
the first characteristic value includes the width of the first wiring and the wiring resistance value of the first circuit,
the Mth characteristic value is the wiring resistance value of the Mth circuit, and
the evaluation includes calculating an amount of shift of the closed-space patterns based on the interval and the ratio of the wiring resistance value of the first circuit and the wiring resistance value of the Mth circuit.

13. A correction method of a mask pattern comprising evaluating a mask pattern using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, and further comprising correcting the mask pattern on the basis of the evaluation result of the mask pattern, the evaluating the mask pattern including:
arranging mask patterns to be evaluated so that the Mth wiring or a layer in the vicinity thereof is locally removed;
electrically calculating a first characteristic value indicating a characteristic of the first circuit including at least the wiring width of the first wiring;
electrically calculating an Mth characteristic value which is a value indicating the characteristic of the Mth circuit and dependent on a geometric relationship between the mask pattern to be evaluated and the Mth wiring; and
evaluating the characteristic of the mask pattern to be evaluated based on the first characteristic value to the Mth characteristic value obtained for at least two circuit groups of the N circuit groups.

14. The correction method of a mask pattern according to claim 13,
wherein the mask pattern to be evaluated is a closed-space pattern formed from above the Mth wiring up to the Mth wiring or a layer in the vicinity thereof,
the Mth characteristic value is a wiring resistance value of the Mth circuit, and
the evaluation includes outputting of the value of the finest wiring width out of the wiring widths with which the wiring resistance value of the Mth circuit becomes substantially 0 as the dimension of the closed-space pattern.

15. The correction method of a mask pattern according to claim 13,
wherein the mask pattern to be evaluated is closed-space patterns formed in the vicinity of edges of the Mth wiring so as to form a pair sandwiching the Mth wiring in a plan view,
the first characteristic value includes the width of the first wiring and the wiring resistance value of the first circuit,
the Mth characteristic value is the wiring resistance value of the Mth circuit; and
the evaluation includes calculating a length of an interval between the closed-space patterns from the ratio of the wiring resistance value of the first circuit and the wiring resistance value of the Mth circuit.

16. The correction method of a mask pattern according to claim 13,
wherein the mask pattern to be evaluated is formed so as to shift from the center line of the Mth circuit by a predetermined amount of shift, and
the evaluation includes correcting the characteristic of the mask pattern to be evaluated by the amount of shift.

17. The correction method of a mask pattern according to claim 13,
wherein the mask pattern to be evaluated is a closed-space pattern in a predetermined size from above the Mth wiring up to the Mth wiring or a layer in the vicinity thereof,
the Mth characteristic value is the wiring resistance value of the Mth circuit, and
the evaluation includes calculating an amount of shift of the closed-space pattern by comparing the value of the finest wiring width out of the wiring width with which the wiring resistance value of the Mth circuit becomes substantially 0 with the size of the closed-space pattern.

18. The correction method of a mask pattern according to claim 13,
wherein the mask pattern to be evaluated is closed-space patterns formed in the vicinity of edges of the Mth wiring, the closed-space patterns being set apart from each other by a predetermined interval so as to form a pair sandwiching the Mth wiring in a plan view,
the first characteristic value includes the width of the first wiring and the wiring resistance value of the first circuit,
the Mth characteristic value is the wiring resistance value of the Mth circuit, and
the evaluation includes calculating an amount of shift of the closed-space patterns based on the interval and the ratio of the wiring resistance value of the first circuit and the wiring resistance value of the Mth circuit.

19. A manufacturing method of an exposure mask comprising a correction method of a mask pattern including evaluating a mask pattern using a circuit arrangement provided with N (N is a natural number of 2 or greater) circuit groups having wiring whose widths are different to each other, each circuit group including first to Mth circuits having first to Mth (M is a natural number of 2 or greater) wiring formed of a conductive layer, respectively, each of the first to the Mth wiring having the same width that is electrically measurable, and further including correcting the mask pattern on the basis of the evaluation result of the mask pattern, the evaluating the mask pattern having:
arranging mask patterns to be evaluated so that the Mth wiring or a layer in the vicinity thereof is locally removed;
electrically calculating a first characteristic value indicating a characteristic of the first circuit including at least the wiring width of the first wiring;
electrically calculating an Mth characteristic value which is a value indicating the characteristic of the Mth circuit and dependent on a geometric relationship between the mask pattern to be evaluated and the Mth wiring; and
evaluating the characteristic of the mask pattern to be evaluated based on the first characteristic value to the Mth characteristic value obtained for at least two circuit groups of the N circuit groups.

20. The manufacturing method of an exposure mask according to claim 19,
wherein the mask pattern to be evaluated is a closed-space pattern formed from above the Mth wiring up to the Mth wiring or a layer in the vicinity thereof,
the Mth characteristic value is a wiring resistance value of the Mth circuit, and
the evaluation has outputting of the value of the finest wiring width out of the wiring widths with which the wiring resistance value of the Mth circuit becomes substantially 0 as the dimension of the closed-space pattern.

* * * * *

UNITED STATES PATENT AND TRADEMARK OFFICE
CERTIFICATE OF CORRECTION

| | |
|---|---|
| PATENT NO. | : 7,569,403 B2 |
| APPLICATION NO. | : 11/132397 |
| DATED | : August 4, 2009 |
| INVENTOR(S) | : Yuji Kobayashi |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1052 days.

Signed and Sealed this

Seventh Day of September, 2010

David J. Kappos
*Director of the United States Patent and Trademark Office*